United States Patent [19]
Canaperi et al.

[11] Patent Number: 6,114,249
[45] Date of Patent: *Sep. 5, 2000

[54] CHEMICAL MECHANICAL POLISHING OF MULTIPLE MATERIAL SUBSTRATES AND SLURRY HAVING IMPROVED SELECTIVITY

[75] Inventors: Donald Francis Canaperi, Bridgewater, Conn.; Rangarajan Jagannathan, Essex Junction, Vt.; Mahadevaiyer Krishnan, Hopewell Junction, N.Y.; Clifford Owen Morgan, Burlington; Terrance Monte Wright, Williston, both of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/037,205

[22] Filed: Mar. 10, 1998

[51] Int. Cl.$^7$ .................................................. H01L 21/302
[52] U.S. Cl. ......................... 438/692; 438/691; 438/693
[58] Field of Search ...................................... 438/692, 693, 438/691; 252/79.1, 79.5; 134/1.3, 1.2

[56] References Cited

U.S. PATENT DOCUMENTS

| | | | |
|---|---|---|---|
| 2,823,186 | 2/1958 | Nickerson . | |
| 3,860,431 | 1/1975 | Payne et al. | 106/36 |
| 4,169,337 | 10/1979 | Payne | 51/283 R |
| 4,462,188 | 7/1984 | Payne | 51/283 R |
| 4,588,421 | 5/1986 | Payne | 51/308 |
| 4,892,612 | 1/1990 | Huff | 438/693 |
| 4,910,155 | 3/1990 | Cote et al. | 437/8 |
| 4,944,836 | 7/1990 | Beyer et al. | 156/645 |
| 5,230,833 | 7/1993 | Romberger et al. | 252/363.5 |
| 5,376,222 | 12/1994 | Miyajima et al. | 156/636 |
| 5,407,526 | 4/1995 | Danielson et al. | 21/304 |
| 5,486,129 | 1/1996 | Sandhu et al. | 451/5 |
| 5,494,857 | 2/1996 | Cooperman et al. | 438/692 |
| 5,700,180 | 12/1997 | Sandhu et al. | 451/5 |
| 5,728,308 | 3/1998 | Muroyama | 216/88 |
| 5,904,159 | 5/1999 | Kato et al. | 134/7 |
| 5,935,869 | 8/1999 | Huynh et al. | 438/692 |

FOREIGN PATENT DOCUMENTS

| | | | |
|---|---|---|---|
| 5062953 | 3/1993 | Japan | H01L 21/304 |
| 5067600 | 9/1993 | Japan | H01L 21/304 |
| 10242090 | 9/1998 | Japan | H01L 21/304 |

OTHER PUBLICATIONS

Glass Planarization by Stop–Layer Polishing, IBM Technical Disclosure Bulletin, vol. 26 No. 8 pp. 4700–4701, Jan. 1985.

"Planarization of ULSI Topography over Variable Pattern Densities," Journal of Electrochemical Society, vol. 138, No. 2 pp. 506–509, Feb. 1991.

"Integration of Chemical Mechanical Polishing into CMOS Integrated Circuit Manufaacturing" Thin Solid Films, 220, pp. 1–7, 1992.

"A Half–Micron CMOS Logic Generation," IBM Journal of Research and Development, vol. 39 No. 1/2, pp. 215–224, Jan. 03, 1995.

"Characteristics of CMOS Device Isolation for the ULSI Age," IEDM Technical Digest, pp. 671–674, 1994.

"A Variable Size Shallow Trench Isolation (STI) Technology with Diffused Sidewall Doping for Submicron CMOS," IEDM Technical Digest, pp. 92–95, 1988.

"Shallow Trench Isolation for Ultra Large Scale Integrated Devices," Journal of Vaccum Science and Technology B vol. 12 No. 1, pp. 54–58, Jan. 02, 1994.

"A New Planarization Technique, Using a Combination of RIE and Chemical Mechanical Polish (CMP)," IEDM Technical Digest, pp. 61–64, 1989.

"Dishing Effects in a Chemical Mechanical Polishing Planarization Process for Advanced Trench Isolation," Applied Phys. Lett., vol. 61, No. 11, pp. 1344–1346, Sep. 1992.

"The Chemistry of Silica," Wiley–Interscience, pp. 63, 1979.

*Primary Examiner*—Benjamin L. Utech
*Assistant Examiner*—Matthew Anderson
*Attorney, Agent, or Firm*—Howard J. Walter, Jr.

[57] ABSTRACT

A colloidal silica slurry containing triethanolamine is used in a chemical mechanical polishing process to polish multiple material substrates, such as silicon wafers containing silicon oxide where a thin underlayer of silicon nitride is used as a stop layer. The colloidal silica slurry containing triethanolamine is capable of achieving an oxide to nitride selectivity during polishing up to a demonstrated ratio of 28:1.

5 Claims, No Drawings

CHEMICAL MECHANICAL POLISHING OF MULTIPLE MATERIAL SUBSTRATES AND SLURRY HAVING IMPROVED SELECTIVITY

BACKGROUND OF THE INVENTION

1. Technical Field

This invention relates generally to a method and a slurry for selectively polishing substrates having different materials deposited thereon, and more particularly to such a method and slurry for the chemical mechanical polishing of a substrate having both oxide and nitride films deposited thereon.

2. History of Related Art

Global planarization of topographical features with diverse pattern densities is commonly used in the manufacture of high performance ultra-large scale integration (ULSI) devices. Structures with increasingly smaller device dimensions, high aspect ratio features, denser packaging arrangements, and higher metal-insulator wiring levels demand stringent planarity requirements. Short wave-length photolithography, used to define masks for the subsequent formation of conductive circuit features, imposes additional constraints on vertical topographical variation, requiring that the entire pattern be maintained within the depth of focus of the light beam, normally about ±0.3 $\mu$m. With increasingly higher numbers of wiring levels, problems with non-planarity become severe and impact the yield and performance of ULSI devices. Shallow trench isolation (STI) in combination with chemical-mechanical polishing (CMP) has been proposed to replace the Local Oxidation of Silicon (LOCOS) technology for <0.5 micron devices for enhanced performance and improved manufacturability. For example, the combination of shallow trench isolation and chemical-mechanical polishing is described in an article titled *A VARIABLE-SIZE SHALLOW TRENCH ISOLATION (STI) TECHNOLOGY WITH DEFUSED SIDE WALL DOPING FOR SUBMICRON CMOS,* authored by B. Davari et al. in *IDEM Technical Digest* (1988), pgs. 92–95, and in an article titled *SHALLOW TRENCH ISOLATION OF ULTRA-LARGE-SCALE INTEGRATED DEVICES,* authored by K. Blumenstock et al and published in *Journal of Vacuum Science Technology,* January–February 1994, pgs. 54–58.

In the shallow trench isolation process described in the above references, a photoresist is used to define isolation on a silicon nitride-oxide pad. The layers are then dry etched and trenches in a silicon base are defined using a reactive ion etch (RIE). The trenches are filled with low pressure chemical vapor deposition (LPCVD) oxide. A planarization scheme is required to generally remove all oxide from the nitride surface with some nitride remaining on the active areas. In addition, field oxide should be removed above the silicon surface after planarization. This is generally accomplished by RIE etch back, followed by CMP as described by B. Davari in an article titled *A NEW PLANARIZATION TECHNIQUE USING A COMBINATION OF RIE AND CHEMICAL MECHANICAL POLISH (CMP),* Published on pgs. 61–64 of the 1989 issue of *IEDM Technical Digest.* The combination of RIE etch back followed by chemical mechanical polishing provides a wider planarization window and also eliminates some remnant non-planarity after RIE. More recently, planarization without the dry etch step, i.e., CMP only, has been proposed by C. Yu, et al. titled *Dishing Effects in a Chemical Mechanical Polishing Planarization Process for Advanced Trench Isolation,* in the Sep. 14, 1992 issue of *Applied Physical Letters,* pgs. 1344–1346.

Whichever method is used, the challenge is to achieve global planarization over >200 $\mu$m range and over diverse pattern densities without severe dishing as described in the Yu et al. article. In order to achieve global planarization over such a range, a polishing slurry with a high selectivity ratio with respect to oxide and nitride polish rates is required. A slow polish rate for nitride is necessary to ensure that a desired post planarization oxide thickness can be reliably achieved and the silicon subsurface can be protected. Colloidal silica slurries currently in use provide selectivity ratios of 3:1 to 4:1 for oxide to nitride in blanket films. However, this selectivity is reduced on product wafers which have widely varying pattern factors in non-ideal thickness uniformity across the wafer. Frequently, this results in over-polish, under-polish, and non-uniform thickness in the final product. To overcome these problems, slower polishing rates, repeated inspections and several thickness measurements, and stringent process controls are required to assure product quality. All of these measures reduce efficiency, through-put and increase process costs. The slower polish rates and repeated inspection steps also increase the capital investment for polishing and cleaning tools.

The present invention is directed to overcoming the problems set forth above. It is desirable to have a slurry suitable for use in a method by which the oxide to nitride polishing rate selectivity ratio is significantly greater than 4:1. It is also desirable to have such a method in which the initial polishing rate for oxide is relatively high to quickly remove an oxide overlayer, and then the slurry modified to enhance the selectivity ratio between oxide and nitride during final polishing.

SUMMARY OF THE INVENTION

In accordance with one aspect of the present invention, a method for chemical mechanical polishing of a material in a multiple material substrate includes providing a substrate having a first film formed of a first material and second film formed of the second material underlying predetermined portions of the first film, providing a polishing slurry which reacts with the first film and the second film, and removing a major portion of the first film. The method further includes adding triethanolamine to the slurry in an amount sufficient to increase the reactivity of the slurry to the second film with respect to the reactivity to the first film, and removing a remaining portion of the first film. The polishing is interrupted when the first film is completely removed from the underlying portions of the second film, whereby the second film is exposed and portions of the first film adjacent the exposed second film are planarly aligned with the second film.

Other features of the method for controlling the chemical mechanical polishing of a material in a multiple material substrate include the slurry comprising colloidal silica dispersed in a solution of potassium hydroxide and water and has a pH of from about 10 to about 11. Additional features including triethanolamine being added to the slurry of colloidal silica dispersed in a potassium hydroxide and water solution in an amount sufficient to provide a concentration of from about 10% to about 40%, and preferably about 30%, triethanolamine in the slurry.

Still further features of the method for chemical mechanical polishing of a material in a multiple material substrate include the multiple material substrate having the first film comprising silicon oxide and the second film comprising silicon nitride.

In another aspect of the present invention, a slurry for chemical mechanical polishing of a multiple material substrate comprises, by volume, from about 1% to about 15% fumed colloidal silica, from about 0.0001% to about 6% potassium hydroxide, from about 10% to about 40% triethanolamine, and from about 10% to about 90% water with a pH range of 10 to 12.

Other features of the slurry embodying the present invention include the slurry preferably comprising about 10.2% fumed colloidal silica, about 0.0001% potassium hydroxide, about 30% triethanolamine, and about 60% water, and having a pH of about 10.5.

DETAILED DESCRIPTION OF PRESENTLY PREFERRED EXEMPLARY EMBODIMENTS

The chemical mechanical polishing (CMP) process consists of mechanical and chemical components. The mechanical component in the CMP process is affected by the hardness and porosity of the oxide layer. It is believed that the chemical component for oxide removal involves depolymerization of the hydrated surface oxide layer catalyzed by hydroxide ions to form silicate which subsequently decomposes to form silicon dioxide. The mechanical action loosens the surface oxide layer resulting in an appreciable rate of removal of oxide from the silicon wafer. The mechanism for nitride removal involves the reaction of nitride with water to form silicon dioxide and ammonia with the formation of silicon oxynitride as an intermediate step. Based on the mechanical and chemical mechanisms described above, the selectivity ratio of oxygen/nitride polish rates was studied by adding organic additives.

The additives to the polishing slurry, or wet etchant, were chosen to meet several important criteria: high solubility in water, no impact on colloid stability, i.e., settling, agglomeration, etc., and minimal change in polishing rate so that there is no significant impact on product throughput.

Several amino alcohol additives of the general structure R1R2R3N with R=H, OH—$CH_2$—$CH_2$, or OH-Isopropyl, were evaluated over a wide range of concentrations in a silica slurry typically used to polish silicon oxides. In the following tests, the base silica slurry contained about 12% fumed colloidal silica dissolved in a potassium hydroxide solution containing about 0.0001% potassium hydroxide and 60% water. Other suitable base slurry compositions may contain, by volume, from about 1% to about 15% fumed colloidal silica, from about 0.0001% to about 6% potassium hydroxide, and from about 10% to about 90% water with a pH range of 10 to 12. Desirably, the slurry has a pH of from about 10 to about 11. Specifically, the evaluated additives to the base slurry included monoethanolamine (R1=R2=H, R3=OH—$CH_2$—$CH_2$), diethanolamine (R1=H, R2=R3=OH—$CH_2$—$CH_2$), triethanolamine (R1=R2=R3=OH—$CH_2$—$CH_2$), and tri-isopropanolamine (R1=R2=R3=OH-Isopropyl). The polishing rates for blanket silicon oxide and silicon nitride films were determined for fixed measurements taken before and after polishing. The selectivity ratios were calculated from the average polish rates. The stated concentrations of the additives are reported by volume percent.

TEST EXAMPLE 1

The first test demonstrates the effect of the above identified amino-alcohols on the polishing rate selectivity of oxide to nitride at ambient temperature. Low pressure chemical vapor deposition (LPCVD) oxide and nitride layers were polished using a Strasbaugh Model 6DA DC-1 polisher. A 5 psi down force was applied by a Suba IV pad. Both the carrier and platen were rotated at 60 rpm. The measured test results and calculated selectivity ratio of oxide to nitride polishing rates are presented below in Table 1. In the following tables, the following abbreviations are used: SS for the silica slurry, MEA for monoethanolamine, DEA for diethanolamine, TEA for triethanolamine, and TIPA for tri-isopropanolamine.

TABLE 1

Oxide Nitride Selectivity Effect of Additives
LPCVD Oxide/LPCVD Nitride
Polishing Rates in Å/min

| System | pH | Oxide | Nitride | Selectivity |
|---|---|---|---|---|
| Silica Slurry (§) | 10.1 | 753 | 250 | 3.0 |
| § + MEA 9% | 12.0 | 244 | 101 | 2.8 |
| § + DEA 8% | 11.4 | 177 | 64 | 2.8 |
| § + DEA 15% | 11.6 | 100 | 36 | 2.4 |
| § + TEA 15% | 10.8 | 758 | 130 | 5.8 |
| § + TEA 20% | 11.0 | 484 | 71 | 6.8 |
| § + TIPA 30% | 10.6 | 455 | 133 | 3.4 |
| § + TIPA 40% | 10.8 | 221 | 99 | 2.2 |

The additives monoethanolamine and diethanolamine show a reduction in the rate of polishing of both oxide and nitride with no discernable impact on selectivity. Triethanolamine, however, shows enhanced selectivity at both the 15% and 20% volume concentration levels. The rate of nitride polishing is considerably reduced with only a small reduction in the oxide polishing rate. Tri-isopropanolamine shows no significant improvement in selectivity and lower oxide and nitride polishing rates.

TEST EXAMPLE 2

The selectivity enhancement of triethanolamine, as demonstrated in test sample one, appears to be influenced by the concentration of the additive to the silica slurry. In Test Example 2, the polishing was carried out on a Westech 372M/4100 8-inch polisher at a temperature of 115° F. (46° C.). A down force of 6 psi was applied by a Suba VI pad, while the carrier was rotated at 45 rpm and the platen at 23 rpm. The measured results, and the respective calculated oxide/nitride selectivity ratios, based upon the measured results, is summarized below in Table 2.

TABLE 2

Oxide - Nitride Selectivity Improvement
Polishing Rates in Å/min
LPCVD Oxide/LPCVD Nitride

| System | Oxide | Nitride | Selectivity | Enhancement |
|---|---|---|---|---|
| Silica Slurry (§) | 1194 | 276 | 4.3 | |
| § + TEA 15% | 1081 | 235 | 4.6 | 1.1X |
| § + TEA 20% | 1044 | 127 | 8.2 | 1.9X |
| § + TEA 22.5% | 1020 | 98 | 10.4 | 2.4X |
| § + TEA 25% | 994 | 71 | 14.0 | 3.3X |
| § + TEA 30% | 876 | 38 | 23.0 | 5.3X |

As indicated in Table 2, there was no significant improvement in selectivity at a volume concentration of 15% triethanolamine. However, from 20% to 30% triethanolamine, the selectivity ratios increased from 8.2 to 23.0. Thus, there is a 5.3X enhancement in selectivity at 30% triethanolamine, by volume. Higher concentrations of triethanolamine were not tested due to the decrease in the oxide polishing rate. However, based on the above test, it is believed that a silica slurry having a triethanolamine concentration, by volume, of from about 10% to about 40%, and preferably about 30% would provide a beneficially selective polishing rate.

TEST SAMPLE 3

The effect of polishing temperature on the selectivity enhancement was studied over a wide range of temperatures. The polishing conditions in Test Sample 3 were the same as described above with respect to Test Sample 2, except for temperature variation. The selectivity ratio of both silica slurry and silica slurry plus 30%, by volume, triethanolamine, were calculated based on measured test results. The results are shown in below in Table 3.

TABLE 3

Oxide-Nitride Selectivity Improvement
LPCVD Oxide/LPCVD Nitride
Selectivity

| Temperature | 90° F. (32° C.) | 115° F. (46° C.) | 140° F. (60° C.) |
| --- | --- | --- | --- |
| Silica Slurry (§) | 4.5 | 4.3 | 4.4 |
| § + TEA 30% | 22.7 | 23.0 | 24.0 |
| Enhancement | 5X | 5.3X | 5.4X |

It was noted that approximately the same level of enhancement was observed from 90° F. (32° C.) to 140° F. (60° C.). Thus, it appears that temperature has little effect upon the selectivity ratio of oxide to nitride using the slurry containing 30% triethanolamine.

TEST SAMPLE 4

The colloidal silica slurry containing 30% triethanolamine was prepared as described above, and the effect of slurry aging on the selectivity enhancement was tested. The polishing parameters were the same as described above with respect to Test Sample 2. The selectivity ratio of the silica slurry, and the silica slurry with 30% volume addition of triethanolamine, were calculated based on tests conducted with a fresh slurry and after the slurry had been stored for 30 days. The calculated selectivity ratios and enhancement factors are presented below in Table 4.

TABLE 4

Oxide - Nitride Selectivity Improvement
LPCVD Oxide/LPCVD Nitride
Effect of Slurry Aging

| System | Selectivity | |
| --- | --- | --- |
| Silica Slurry (§) | 4.3 | 4.6 |
| § + TEA 30% | 23.0 | 28.0 |
| | (Fresh) | (30 days) |
| Enhancement | 5.3X | 6X |

The results show that there were no adverse effects on selectivity observed after 30 days of storage.

Thus, the slurry embodying the present invention is capable of significantly enhancing the oxide to nitride polishing rate selectivity of colloidal silica slurries used to polish multiple material substrates containing oxide and nitride components. Advantageously, the method for polishing such substrates is carried out by conventional chemical mechanical polishing techniques. Desirably, to optimize the oxide removal rate during initial polishing, the colloidal silica slurry may be used without the amino alcohol additive. After a major portion of the oxide layer is removed, the amino alcohol, i.e., triethanolamine, may be added in a ratio of from about 10% to about 40%, and preferably about 30%, by volume, to the base colloidal silica slurry. Polishing is then continued until the thin nitride layer is exposed. The polishing process may then be stopped, whereupon a smooth, planar surface is provided on the workpiece without over- or under-polishing.

INDUSTRIAL APPLICABILITY

The present invention provides a quick, easy and reliable method to reach a desired post-planarization film thickness, on which a sacrificial film may be selectively added to the product. For example, a silicon nitride sacrificial layer which would have a slower polish rate relative to the object film and provide a stop film to signal a decrease in the polish rate in the regions where it is placed, improving planarity and protecting the subsurface. For example, in the application described above, using STI techniques, trenches are etched into a silicon surface. The trenches must be exactly filled with silicon oxide so that oxide exists only in the trenches and not on the original silicon surface. To be filled exactly, the trenches must be overfilled and polished back, however, the original silicon surface must not be polished or damaged. To accomplish this, a thin layer of silicon nitride is deposited on the original silicon surface. The silicon nitride layer is etched through when the trenches are etched and then the remaining portions of the silicon nitride layer are covered when the trenches are overfilled. The enhanced selectivity provided by the triethanolamine slurry additive allows the oxide to be polished back more quickly while reducing the risk of polishing through the nitride stop layer and damaging the original silicon surface. A major limitation of the STI process is the allowable pad nitride thickness on 16+MB memory products. A thick polish stop film is known to create retention fails. The present invention effectively improves the viability and process window of thin nitride polish stop layers, thus preventing over polish damage without incurring retention fails due to a thick polish stop layer.

Although the present invention is described in terms of a preferred exemplary embodiment with specific illustrative examples, those skilled in the art will recognize that changes in the volume concentrations and specific substrate materials described herein may be made without departing from the spirit of the invention. Such changes are intended to fall within the scope of the following claims. Other aspects, features, and advantages of the present invention may be obtained from a study of this disclosure, along with the appended claims.

What is claimed is:

1. A method for controlling the polishing rate of a material in a multiple material substrate comprising:

providing a substrate having a first film formed of a first material having a first thickness and a second film formed of a second material underlying at least portions of said first film;

providing a slurry which reacts with said first film and said second film;

removing a major portion the thickness of said first film by chemical mechanically polishing said substrate with said slurry;

without interrupting the polishing of said substrate, modifying the composition of said slurry by adding triethanolamine to the slurry in an amount sufficient to increase the selectivity of the polish rate of the slurry to the first film with respect to the second film;

continuing to polish said substrate to remove a remaining portion of the first film by chemical mechanically polishing said substrate with said slurry containing triethanolamine; and interrupting said polishing when said first film is completely removed from said underlying portions of said second film whereby portions of said second film are exposed and said first film is substantially coplanarly aligned with said second film.

2. A method for controlling the polishing rate of a material in a multiple material substrate, as set forth in claim 1, wherein said slurry contains colloidal silica dispersed in a solution of potassium hydroxide and water, and has a pH of from about 10 to about 11.

3. A method for controlling the polish rate of a material in a multiple material substrate, as set forth in claim 2, wherein said triethanolamine is added to said slurry comprising colloidal silica dispersed in water in an amount sufficient to provide a concentration of from about 10 percent to about 40 percent triethanolamine.

4. A method for controlling the polish rate of a material in a multiple material substrate, as set forth in claim 3, wherein said triethanolamine is added to said slurry comprising colloidal silica dispersed in water in an amount sufficient to provide a concentration of about 30 percent triethanolamine in said slurry.

5. A method for controlling the polish rate of a material in a multiple material substrate, as set forth in claim 1, wherein said first film is silicon oxide and said second film is silicon nitride.

\* \* \* \* \*